(12) United States Patent
Woo et al.

(10) Patent No.: US 9,287,209 B2
(45) Date of Patent: Mar. 15, 2016

(54) METAL FINGER CAPACITOR FOR HIGH-K METAL GATE PROCESSES

(75) Inventors: Agnes Neves Woo, Encino, CA (US); Pascal Tran, Irvine, CA (US); Akira Ito, Irvine, CA (US); Guang-Jye Shiau, Irvine, CA (US); Chao-Yang Lu, Sunnyvale, CA (US); Jung Wang, Laguna Niguel, CA (US)

(73) Assignee: Broadcom Corporation, Irvine, CA (US)

( * ) Notice: Subject to any disclaimer, the term of this patent is extended or adjusted under 35 U.S.C. 154(b) by 113 days.

(21) Appl. No.: 13/338,492

(22) Filed: Dec. 28, 2011

(65) Prior Publication Data

US 2013/0113077 A1 May 9, 2013

Related U.S. Application Data

(60) Provisional application No. 61/555,807, filed on Nov. 4, 2011.

(51) Int. Cl.
| | |
|---|---|
| *H01L 23/522* | (2006.01) |
| *H01L 27/02* | (2006.01) |
| *H01L 27/01* | (2006.01) |
| *H01L 49/02* | (2006.01) |

(52) U.S. Cl.
CPC .......... *H01L 23/5223* (2013.01); *H01L 23/522* (2013.01); *H01L 23/5222* (2013.01); *H01L 23/5225* (2013.01); *H01L 27/0207* (2013.01); *H01L 28/90* (2013.01); *H01L 27/016* (2013.01); *H01L 28/86* (2013.01); *H01L 2924/0002* (2013.01)

(58) Field of Classification Search
CPC ............ H01L 23/5225; H01L 23/5223; H01L 23/5222; H01L 27/0805
USPC .......................... 257/532, E29.002, 300–307
See application file for complete search history.

(56) References Cited

U.S. PATENT DOCUMENTS

| | | | | | |
|---|---|---|---|---|---|
| 5,583,359 | A | * | 12/1996 | Ng et al. ........................ | 257/306 |
| 6,625,006 | B1 | * | 9/2003 | Aram et al. .................... | 361/313 |
| 6,653,681 | B2 | * | 11/2003 | Appel ............................ | 257/307 |
| 7,714,371 | B2 | * | 5/2010 | Paul et al. ..................... | 257/306 |
| 2006/0030115 | A1 | * | 2/2006 | Chung .......................... | 438/381 |
| 2009/0166619 | A1 | * | 7/2009 | Park ................................ | 257/48 |
| 2009/0230507 | A1 | * | 9/2009 | Riess et al. ..................... | 257/532 |
| 2009/0236648 | A1 | * | 9/2009 | Maeda et al. ................. | 257/296 |
| 2011/0254074 | A1 | * | 10/2011 | Anezaki ......................... | 257/321 |

* cited by examiner

*Primary Examiner* — Zandra Smith
*Assistant Examiner* — Lauren R Bell
(74) *Attorney, Agent, or Firm* — Sterne, Kessler, Goldstein & Fox, P.L.L.C.

(57) ABSTRACT

Embodiments described herein provide a structure for finger capacitors, and more specifically metal-oxide-metal ("MOM") finger capacitors and arrays of finger capacitors. A plurality of Shallow Trench Isolation (STI) formations is associated with every other column of capacitor fingers, with poly fill formations covering the STI formations to provide a more robust and efficient structure.

20 Claims, 6 Drawing Sheets

METAL FINGER CAPACITOR FOR HIGH-K METAL GATE PROCESSES

CROSS-REFERENCE TO RELATED APPLICATIONS

The present application claims the benefit of U.S. Provisional Patent Appl. No. 61/555,807, filed Nov. 4, 2011, which is incorporated herein by reference in its entirety.

BACKGROUND

1. Field of Invention

Embodiments described herein generally relate to structures of an integrated circuit, and more particularly to finger capacitors and arrays of finger capacitors.

2. Related Art

In previous generations of metal-oxide-metal ("MOM") finger capacitors, structural failure frequently occurred over time due to cracking and other causes. Cracking of metal fingers often occurs due to properties of the dielectric material that is utilized within the structure of the MOM finger capacitor and as a result of fabrication steps taken during the MOM finger capacitor fabrication process. In conventional 28 nm integrated circuit technology, the materials that are utilized within the fingers of a MOM finger capacitor based on conventional layout requirements, crack over time due at least in part due to moisture that accumulates during fabrication. For example, during wet etching, moisture can accumulate in the dielectric material because of the porous nature of some of the materials that are utilized. Over time, with the application of voltage and the presence of moisture, the dielectric material becomes cracked. Due to the presence of the cracks in the dielectric material, the metal fingers may suffer damage as well.

Accordingly, what is needed is a more sturdy structure of a MOM finger capacitor.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

Figure 1:
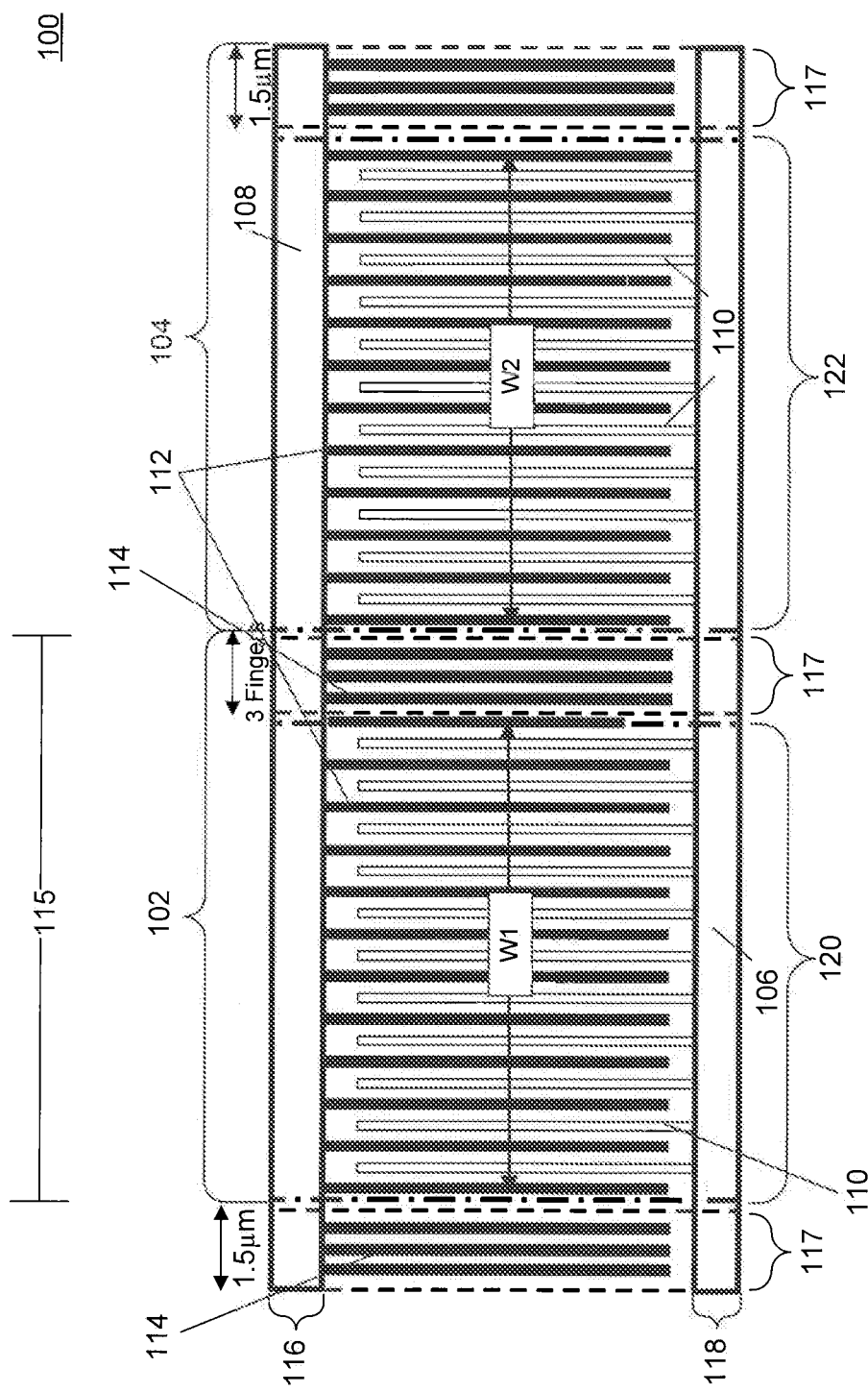
FIG. 1 illustrates a top-view diagram of a capacitor array with parallel capacitors according to an exemplary embodiment of the present invention.

The present invention will now be described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION OF THE INVENTION

The Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

Furthermore, it should be understood that spatial descriptions (e.g., "above", "below", "left," "right," "up", "down", "top", "bottom", etc.) used herein are for purposes of illustration only, and that practical implementations of the structures described herein can be spatially arranged in any orientation or manner.

Embodiments of the invention provide a more sturdy structure of a MOM finger capacitor by including additional poly density and added Shallow Trench Isolation formations that allow for a more robust structure. FIG. 1 schematically illustrates a top-view of a capacitor array 100 according to an exemplary embodiment of the present invention. A first finger capacitor 102 and a second finger capacitor 104 are arranged in parallel in the capacitor array 100. Both of capacitors 102 and 104 are finger capacitors. The capacitor array 100 contains an anode block 106 connected to anode metal fingers 110 and a cathode block 108 connected to cathode metal fingers 112. Since, the respective capacitors (102 and 104) are parallel capacitors, they share the anode block 106 and the cathode block 108. Dummy fingers 114 may also be connected to the cathode block 108. The dummy fingers 114 prevent coupling between the respective anode metal fingers 110 and cathode metal fingers 108 of a respective capacitor with external sources of interference. For example, the dummy fingers 114 prevent coupling between the respective anode metal fingers 110 and cathode metal fingers 108 of capacitor 102 with the respective anode metal fingers 110 and cathode metal fingers 108 of capacitor 104. In an embodiment, the width 115 of the first finger capacitor 102 may be up to 10 µm. Furthermore, any additional finger capacitors may have a similar width as the first finger capacitor 102. In an exemplary embodiment, a width of dummy regions 117 each containing three dummy fingers 114 may be 1.5 µm. Therefore, in a parallel array of capacitors, three dummy fingers 114 are inserted every 10 µm.

In an exemplary embodiment, the heights 116 and 118 of the anode block 104 and the cathode block 106, to which the respective fingers (110, 112, and 114) are attached, are greater or equal to W/10, where W=W1+W2+Wn. W1 is the width of an active region 120 of the first finger capacitor 102 and W2 is the width of an active region 122 of the second finger capacitor 104, and Wn represents the width of respective regions of n numbers of any additional finger capacitors that may be included in parallel in an array. In an embodiment, the active region (120 and 122) refers to parts of the respective finger capacitors (102 and 104) that do not contain dummy fingers 114.

The advantage of utilizing dummy layers, including dummy fingers, is that any metal fingers present near edges of an array of capacitors have a higher probability of curvature or blurring acquired during the manufacturing process. Curvature and blurring causing inefficiencies in a capacitor. Thus, utilizing the end lines in a capacitor array as dummy layers allows for the more accurately manufactured metal fingers to be utilized as the substantive part of a capacitor.

Figure 2:
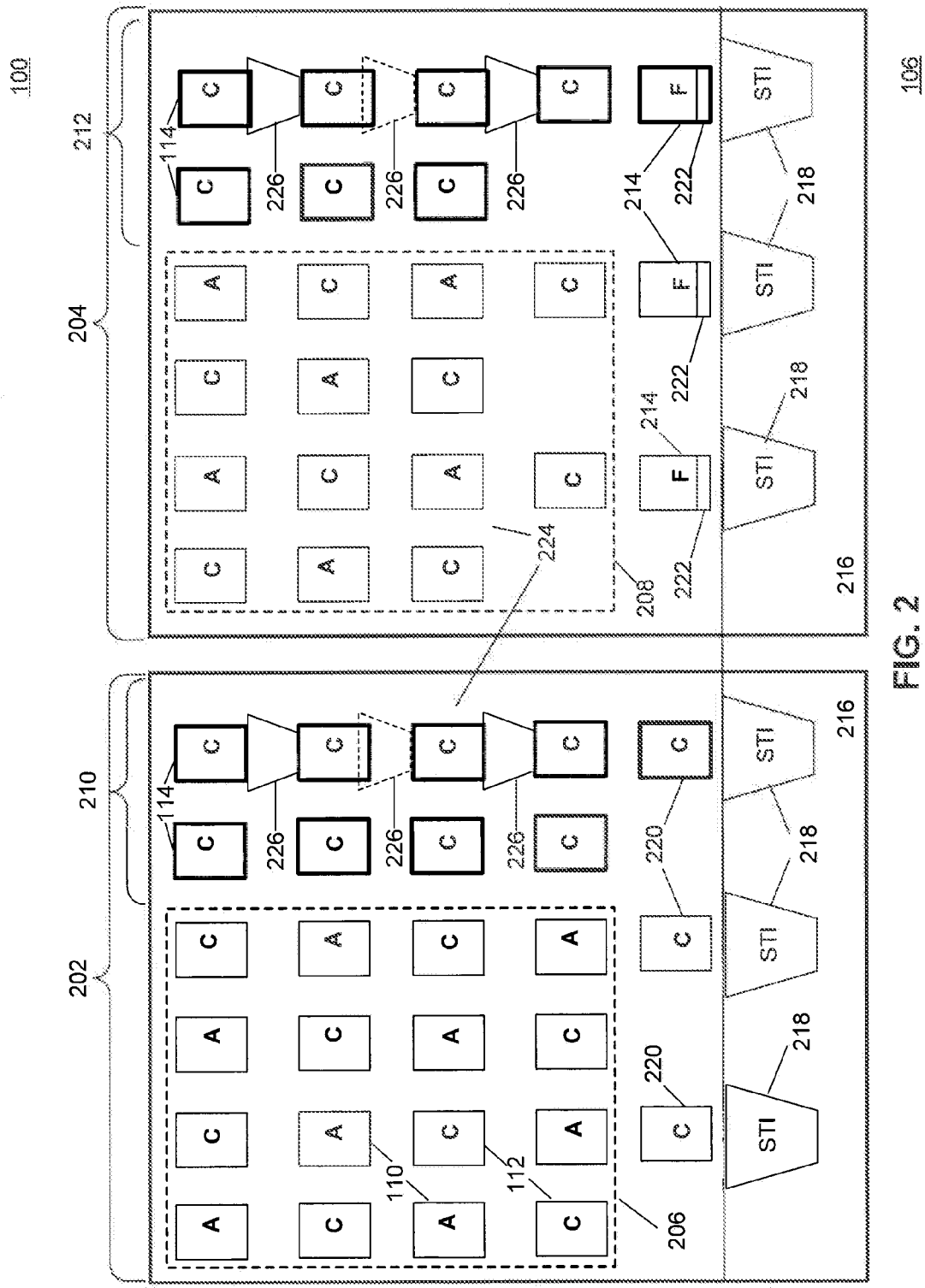
FIG. 2 illustrates a cross-section of some aspects of a capacitor array according to an exemplary embodiment of the present invention.

FIG. 2 illustrates a cross-section of some aspects of a capacitor array 100 accordingly to an exemplary embodiment of the present invention. Cross-sections of a part of a first finger capacitor 202, which may be a MOM finger capacitor, and part of a second finger capacitor 204, which may also be a MOM finger capacitor, are illustrated. In an embodiment, a part of a finger capacitor 202 may be a cross-section of a part of the finger capacitor 102 and a part of a finger capacitor 204 may be a cross-section of a part of the finger capacitor 104. Cross-sections of anode metal fingers 110 in sections 206 and 208 are illustrated with an "A" in them and cross-sections of cathode metal fingers 112 in sections 206 and 208, connected to the cathode block 106, are illustrated with a "C" in them. Sections 210 and 212 illustrate two columns of dummy fingers 114 in each of the respective parts of the finger capacitors (202, 204). In an embodiment, the dummy fingers 114 may be connected to the cathode block 106.

All of the respective dummy fingers 114 in the respective capacitors (102 and 104) are not illustrated in the cross-sections presented.

Cross-sections of floating metal fingers 214 are illustrated with an "F" in them. Furthermore, a substrate 216 includes a plurality of Shallow Trench Isolation ("STI") formations 218 that are present in every other column. In an embodiment, the substrate 216 may be formed of silicon. The STI formations 218 are defined during the manufacturing process by diffusion regions. Each of the STI formations 218 has a poly fill formation above it. In the part of the first finger capacitor 202, each of the poly fill formations forms a Metal Gate ("MG") 220. In the part of the second finger capacitor 204, each of the poly fill formations forms a high-resistance gate ("Hi-R") 222. The MGs 220 in the part of the first finger capacitor are also attached to the cathode block 108, while the Hi-Rs 222 are not connected to either the cathode block 108 or the anode block 106, and thus are floating.

A dielectric 224 is present above the substrate 216 and in-between all of the respective types of metal fingers (110, 112, 114, 220, and 222). In an embodiment, the dielectric may be formed of doped silicon glass or extreme low-K dielectric.

Furthermore, vias 226 are inserted in every other column of the sections 210 and 212 which serve as the dummy regions. Since only two columns are illustrated that include dummy fingers 114, the illustrated right-most column of the respective parts of the cross-sections (202 and 204), entailing dummy fingers 114 have vias 226 inserted that extend in a vertical direction. The vias 226 in a particular column of dummy fingers 114 are present at a constant distance from each other. A cross section of the vias 226 is presented in FIG. 6, with an accompanying discussion presented in the specification below.

In an embodiment, the vias 226 may offer the advantage of strengthening a MOM finger capacitor by providing a route for the moisture to escape in the manufacturing process. Due to the escape of the moisture in the manufacturing process, cracks are less likely to appear as the MOM finger capacitor is utilized by a user. Additionally, since vias 226 comprise of metals, they may provide additional mechanical strength for a more robust structure of the MOM finger capacitor. Additionally, the presence of various STI formations 218 at a constant distance provides a consistency in the base of the finger capacitors (102 and 104) leading to a mechanically more robust structure of a capacitor array.

Figure 3:
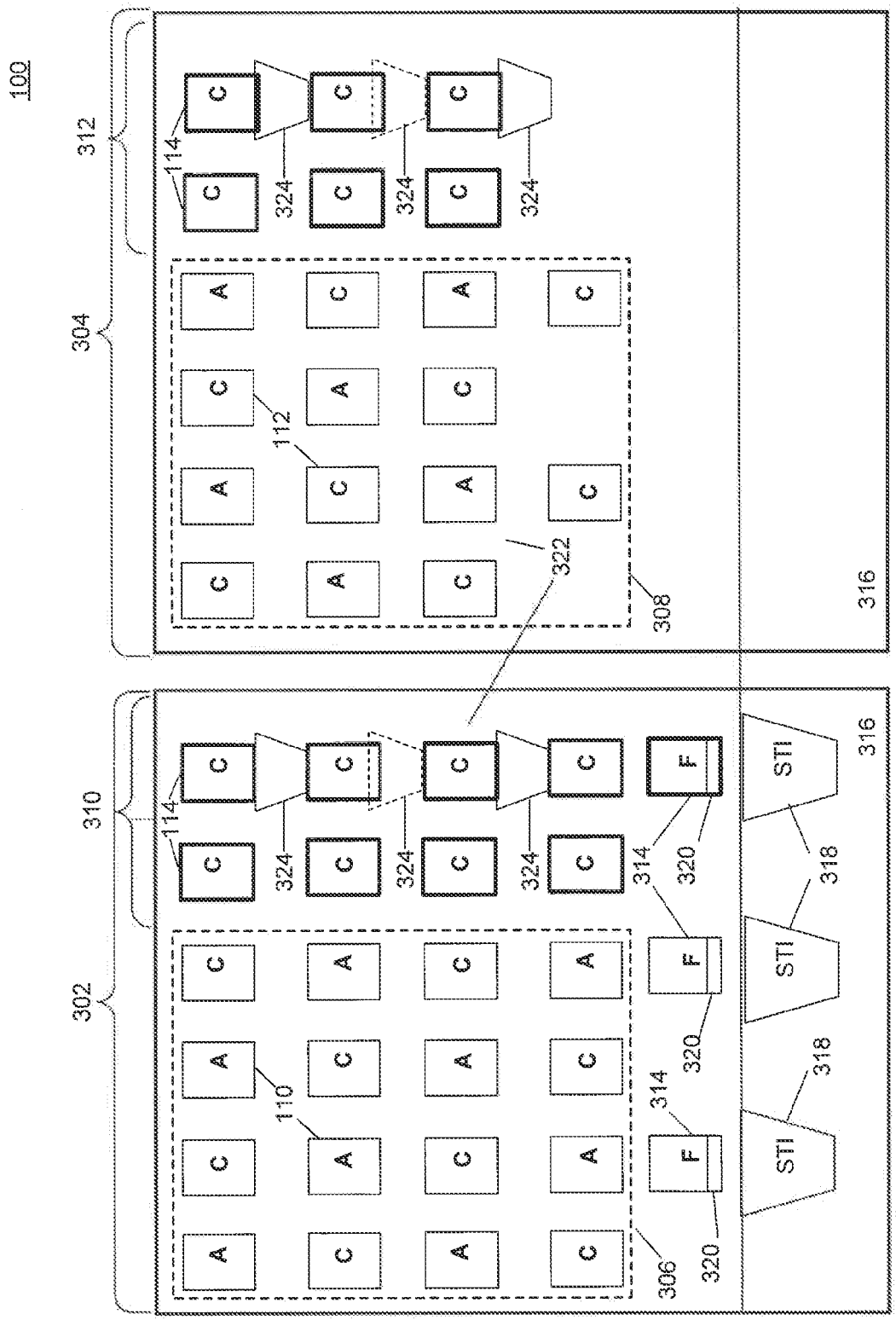
FIG. 3 illustrates a cross-section of some additional aspects of a capacitor array according to an exemplary embodiment of the present invention.

FIG. 3 illustrates a cross-section of some additional aspects of a capacitor array accordingly to another exemplary embodiment of the present invention. A cross-section of a part of a first finger capacitor 302, which may be a MOM capacitor, and part of a second capacitor 304, which in an embodiment may be a Metal-Oxide-Silicon ("MOS") capacitor are illustrated. In an embodiment, a part of a finger capacitor 302 may be functionally similar to a cross section of a part of the finger capacitor 102 while certain elements within MOS capacitor may be similar to elements within finger capacitor 104. Cross sections of anode metal fingers 110 in sections 306 and 308 are illustrated with an "A" in them and cross section of cathode metal fingers 112 in sections 306 and 308, connected to the cathode block 106, are illustrated with a "C" in them. Sections 310 and 312 illustrate two columns of dummy fingers 114 in each of the respective parts of the capacitors (302, 304). In an embodiment, the dummy fingers may be connected to the cathode block 106.

All of the respective dummy fingers 114 in the respective capacitors (102 and MOS capacitor) are not illustrated in the cross-sections presented.

Cross-sections of floating metal fingers 314 are illustrated with an "F" in them. Furthermore, a substrate 316 includes a plurality of Shallow Trench Isolation ("STI") formations 318 that are present in every other column in the part of the first finger capacitor 302. Each of the STI formation 318 has a poly fill formation above it. In the part of the first finger capacitor 302, each of the poly fill formations entailing floating metal fingers 314 forms a high-resistance gate ("Hi-R") 320. The Hi-Rs 320 are not connected to either the cathode block 108 or the anode block 106, and thus are floating. In the part of the second finger capacitor 304, there is not a presence of any STI formations or poly fill formations because a cross-section of a MOS capacitor is illustrated. As known in the art, a MOS capacitor does not contain a poly fill or STI formation.

A dielectric 322 is present above the substrate 316 and in between all of the respective types of metal fingers (110, 112, 114, 320, and 322). In an embodiment, the dielectric may be formed of doped, silicon glass or extreme low-K dielectric.

Furthermore, vias 324 are inserted in every other column of the sections 310 and 312 which serve as the dummy regions. Structurally and functionally, vias 324 are similar to vias 226 discussed above.

Figure 4:
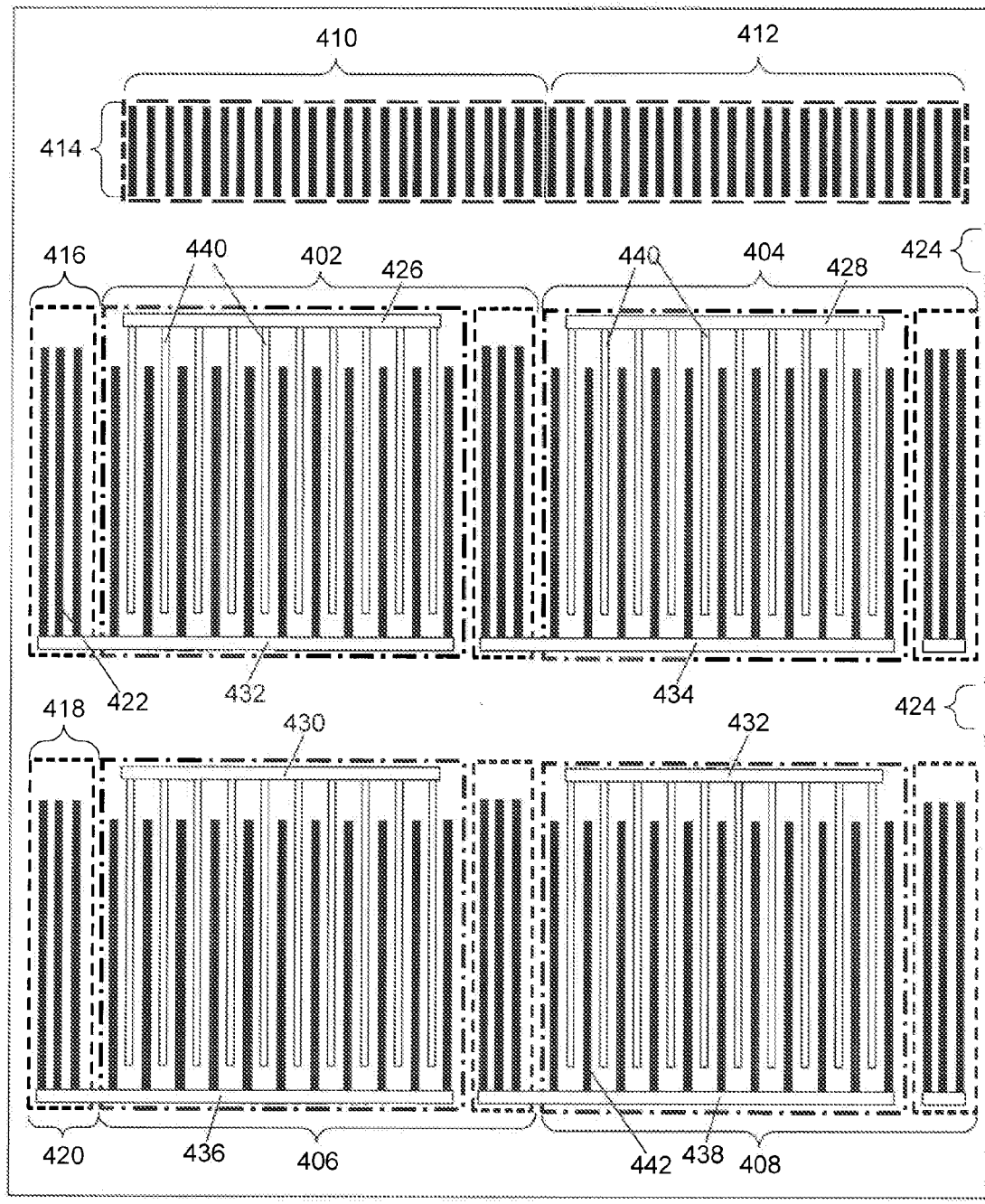
FIG. 4 illustrates a top-view layout of a capacitor array according to another exemplary embodiment of the present invention.

FIG. 4 illustrates a top-view layout of a capacitor array 400 according to an exemplary embodiment of the present invention. It contains four individual capacitors (402, 404, 406 and 408). Furthermore, top dummies (410 and 412) are present above capacitors 402 and 404. In an embodiment, the top dummies (410 and 412) may have a height 414 of 1.5 μm. Additionally, left dummies (416 and 418) are present on the left side of capacitors 402 and 406. In an embodiment, the left dummies may have a width 420 of 1.5 μm and contain three columns of dummy fingers 422. Dummy fingers 422 may be substantially similar to dummy fingers 114.

In an embodiment, a routing channel height 424 is user defined and between 0.2 μm to 1 μm. The routing channel height 424 is the distance between the respective set of capacitors 402 and 404 and the respective set of top layer dummies 410 and 412, as well as the distance between the respective set of capacitors 402 and 404 and the respective set of capacitors 406 and 408.

Each of the respective capacitors (402, 404, 406, and 408) has its own respective anode block (424, 426, 428, and 430) and its own respective cathode block (432, 434, 436 and 438). In an embodiment, anode metal fingers 440 in each of the respective capacitors (402, 404, 406, and 408) are connected to the respective anode blocks (422, 424, 426, and 428). Additionally, cathode metal fingers 442 in each of the respective capacitors (402, 404, 406, and 408) are connected to the respective cathode blocks (432, 434, 436, and 438).

Figure 5:
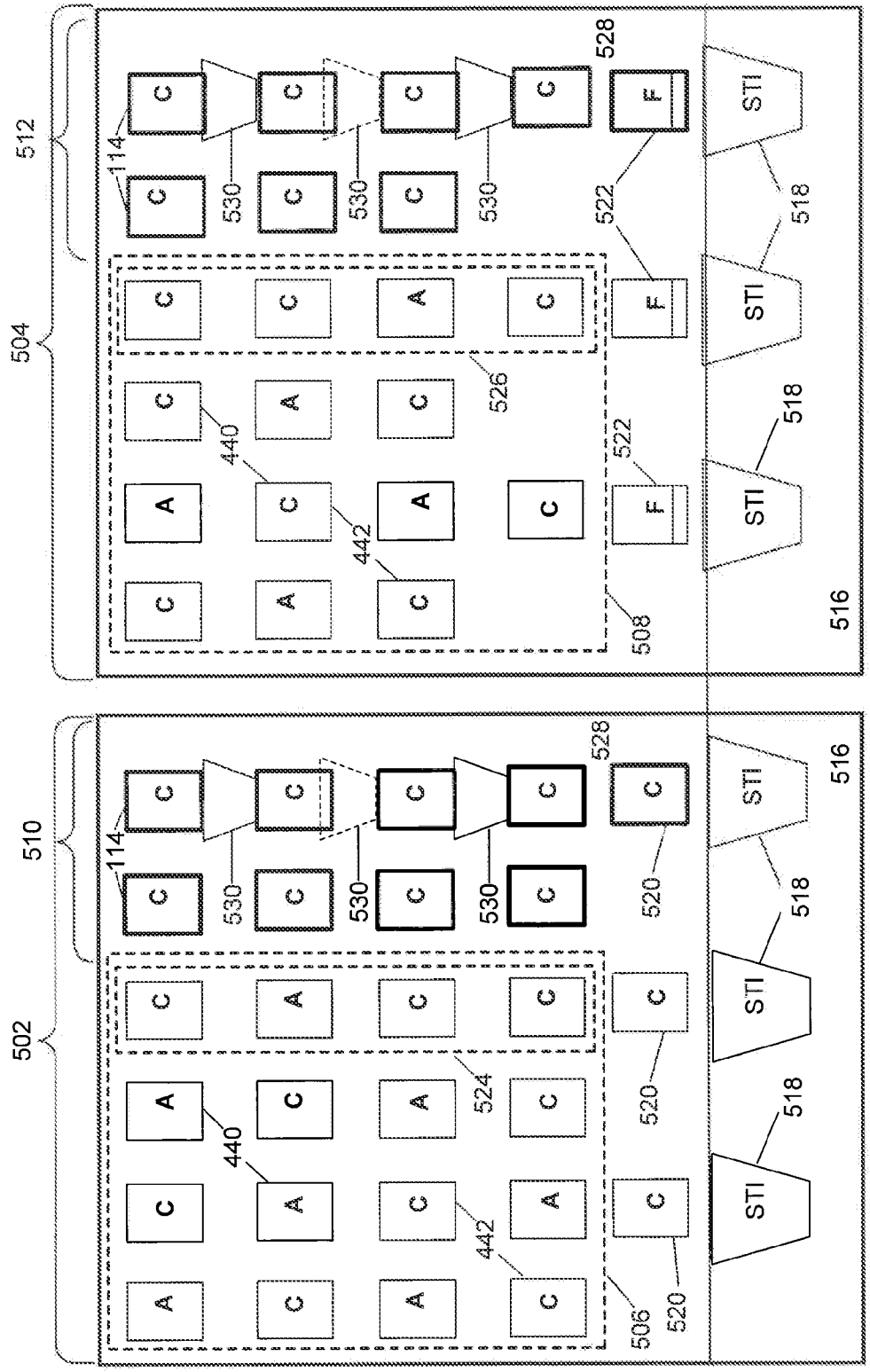
FIG. 5 illustrates a cross section of some aspects of a capacitor array according to another exemplary embodiment of the present invention.

FIG. 5 illustrates a cross-section of some aspects of a capacitor array 400 according to an exemplary embodiment of the present invention. A cross-section of a part of a first finger capacitor 502, which may be a MOM finger capacitor, and part of a second finger capacitor 504, which may also be a MOM finger capacitor, are illustrated. In an embodiment, the part of a finger capacitor 502 may be a cross section of a part of the finger capacitor 402 and the part of a finger capacitor 504 may be a cross section of a part of the finger capacitor 404. In further embodiments, respective parts of the respective capacitors (502 and 504) may be cross-sections of any two independent capacitors that are in a parallel array configuration. Cross sections of anode metal fingers 440 in sections 506 and 508 are illustrated with an "A" in them and cross section of cathode metal fingers 442 in sections 506 and 508, connected to the respective cathode blocks (432 and 434) are illustrated with a "C" in them. Sections 510 and 512 illustrate two columns of dummy fingers 422 in each of the respective parts of the finger capacitors (502, 504). In an embodiment, the dummy fingers are connected to the respective cathode blocks (432 and 434).

All of the respective dummy fingers 422 in the respective capacitors (502 and 504) are not illustrated in the cross-sections presented.

Cross sections of floating metal fingers 522 are illustrated with an "F" in them. Furthermore, a substrate 516 includes a plurality of Shallow Trench Isolation ("STI") formations 518 that are present in every other column. Each of the STI formation 518 has a poly fill formation above it. In the part of the first finger capacitor 502, each of the poly fill formations forms a Metal Gate ("MG") 520. In the part of the second finger capacitor 504, each of the poly fill formation forms a high-resistance gate ("Hi-R") 522. The MGs 520 in the part of the first finger capacitor are also attached to the cathode block 432, while the Hi-Rs 522 are not connected to either the cathode block 434 nor the anode block 428, and thus are floating.

In an embodiment, within respective sections 506 and 508, columns 524 and 526 may contain only cathode metal fingers 442. Thus, the column of metal fingers next to the columns of dummy fingers 422 may only comprise of cathode metal fingers 442 when independent capacitors are utilized in a parallel array configuration.

A dielectric 528 is present above the substrate 516 and in-between all of the respective types of metal fingers (422, 440, 442, 114, 520, and 522). In an embodiment, the dielectric may be formed of doped silicon glass or extreme low-K dielectric. Furthermore, vias 528 are inserted in every other column of the sections 310 and 312 which serve as the dummy regions. Structurally and functionally, vias 528 are similar to vias 226 and 324 discussed above.

Figure 6:
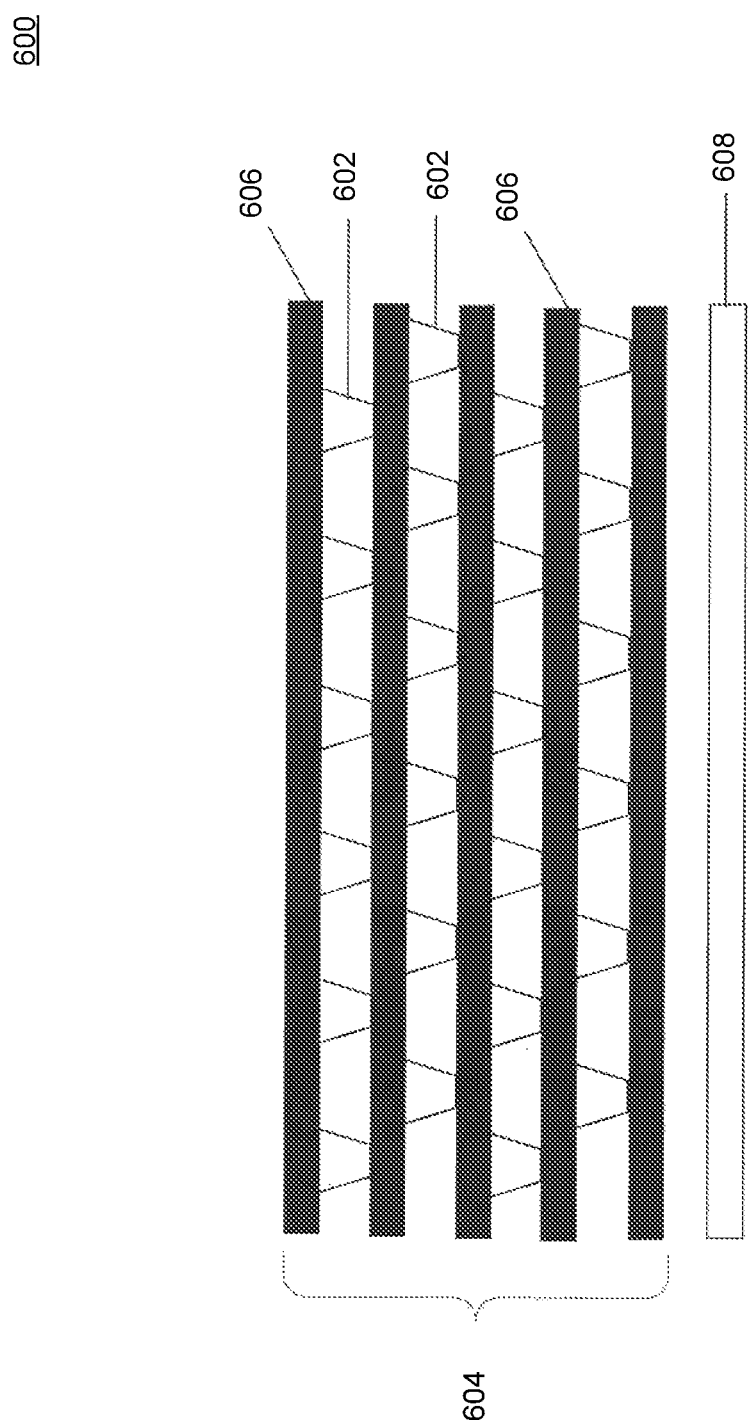
FIG. 6 is a cross-sectional view of a finger capacitor illustrating via layout in the dummy fingers region, according to an exemplary embodiment of the present invention.

FIG. 6 is a cross-sectional view of a finger capacitor 600 illustrating via layout in a dummy fingers region. The bottom metal finger 608 serves as the poly fill formation in a respective MOM finger capacitor. In region 604, there are a plurality of dummy fingers 606 that in an embodiment, may be connected to a cathode block (unillustrated) or may be floating. The cathode block may be functionally similar to cathode blocks 108, 432, 434, 436 and 438. Vias 602 are staggered at a half pitch on alternating layers of the dummy fingers 606. Furthermore, the vias 602 extend in a perpendicular direction from the bottom metal fingers 608 to the top of the region 604 connecting the plurality of dummy fingers 606 in a column. The vias 602 are functionally similar to respective vias 226, 324, and 530.

Other Modifications

In other exemplary embodiments (not shown in the drawings) of the present invention, the number of columns of dummy fingers may be increased or decreased. Additionally, the number of columns of dummy fingers towards the edge of a capacitor array may be different that the number of dummy fingers utilized towards the edges of a respective capacitor within the capacitor array.

CONCLUSION

Embodiments of the invention have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A finger capacitor, comprising:
    a substrate;
    a plurality of shallow trench isolation (STI) formations formed in the substrate;
    a plurality of poly fill formations, each poly fill formation covering a respective STI formation;
    a plurality of columns including a first set of metal fingers intertwined with a second set of metal fingers;
    a cathode block connected to the first set of metal fingers; and
    an anode block connected to the second set of metal fingers, wherein
    the plurality of STI formations are aligned at a substantially constant pitch such that consecutive ones of the plurality of STI formations overlap with every other column from among the plurality of columns, the overlap being in a direction perpendicular to a top surface of the substrate, and wherein remaining columns from among the plurality of columns do not overlap with the plurality of STI formations in the direction perpendicular to the top surface of the substrate, and
    a first metal finger of the first set of metal fingers and a first metal finger of the second set of metal fingers of the every other column from among the plurality of columns are directly aligned with a poly fill formation of the plurality of poly fill formations in the direction perpendicular to the top surface of the substrate.

2. The finger capacitor of claim 1, wherein each poly fill formation forms a metal gate or a high resistance gate.

3. The finger capacitor of claim 1, further comprising a dielectric between adjacent metal fingers from among the first set of metal fingers and the second set of metal fingers.

4. The finger capacitor of claim 3, wherein the dielectric is doped silicon glass or low-K dielectric.

5. The finger capacitor of claim 1, further comprising:
at least three columns of dummy fingers disposed along an edge of the finger capacitor.

6. The finger capacitor of claim 5, wherein the dummy fingers are connected to the cathode block.

7. The finger capacitor of claim 6, further comprising:
a plurality of vias that connect the dummy fingers in a direction perpendicular to a direction of extension of the dummy fingers.

8. The finger capacitor of claim 7, wherein the plurality of vias connect the dummy fingers in every other column from among the at least three columns of dummy fingers.

9. A finger capacitor array comprising:
a plurality of finger capacitors, at least one or more of the plurality of finger capacitors comprising:
a substrate;
a plurality of shallow trench isolation (STI) formations formed in the substrate;
a plurality of poly fill formations;
a plurality of columns including a first set of metal fingers intertwined with a second set of metal fingers;
a respective cathode block connected to the first set of metal fingers; and
a respective anode block connected to the second set of metal fingers, wherein the plurality of STI formations are aligned at a substantially constant pitch such that consecutive ones of the plurality of STI formations overlap with every other column from among the plurality of columns, the overlap being in a direction perpendicular to a top surface of the substrate, and wherein remaining columns from among the plurality of columns do not overlap with the plurality of STI formations in the direction perpendicular to the top surface of the substrate, and
a first metal finger of the first set of metal fingers and a first metal finger of the second set of metal fingers of the every other column from among the plurality of columns are directly aligned with a poly fill formation of the plurality of poly fill formations in the direction perpendicular to the top surface of the substrate.

10. The finger capacitor array of claim 9, wherein each poly fill formation forms a metal gate or a high resistance gate.

11. The finger capacitor array of claim 9, the at least one or more of the plurality of finger capacitors further comprising a dielectric between adjacent metal fingers from among the first set of metal fingers and the second set of metal fingers.

12. The finger capacitor array of claim 11, wherein the dielectric is doped silicon glass or low-K dielectric.

13. The finger capacitor array of claim 9, each respective one of the at least one or more of the plurality of finger capacitors further comprising at least three columns of dummy fingers disposed along an edge of the respective finger capacitor.

14. The finger capacitor array of claim 13, wherein the dummy fingers are connected to the respective cathode block.

15. The finger capacitor array of claim 14, wherein each finger capacitor of the one or more of the plurality of finger capacitors further comprises:
a plurality of vias that connect the dummy fingers in a direction perpendicular to a direction of extension of the dummy fingers.

16. The finger capacitor array of claim 15, wherein the plurality of vias connect the dummy fingers in every other column from among the at least three columns of dummy fingers.

17. The finger capacitor array of claim 9, wherein the at least one or more of the plurality of finger capacitors comprises at least two or more of the plurality of finger capacitors.

18. A finger capacitor, comprising:
a substrate;
a plurality of shallow trench isolation (STI) formations formed in the substrate;
a plurality of poly fill formations, each poly fill formation covering a respective STI formation, and wherein at least one of the poly fill formations of the plurality of poly fill formations is electrically floating;
a plurality of columns including a first set of metal fingers intertwined with a second set of metal fingers;
a cathode block connected to the first set of metal fingers; and
an anode block connected to the second set of metal fingers, wherein
the plurality of STI formations are aligned at a substantially constant pitch such that consecutive ones of the plurality of STI formations overlap with every other column from among the plurality of columns, the overlap being in a direction perpendicular to a top surface of the substrate, and wherein remaining columns from among the plurality of columns do not overlap with the plurality of STI formations in the direction perpendicular to the top surface of the substrate, and
a first metal finger of the first set of metal fingers and a first metal finger of the second set of metal fingers of the every other column from among the plurality of columns are directly aligned with a poly fill formation of the plurality of poly fill formations in the direction perpendicular to the top surface of the substrate.

19. The finger capacitor of claim 18, wherein each poly fill formation forms a metal gate or a high resistance gate.

20. The finger capacitor of claim 18, further comprising a dielectric between adjacent metal fingers from among the first set of metal fingers and the second set of metal fingers.

* * * * *